(12) United States Patent
Wei

(10) Patent No.: US 11,719,720 B2
(45) Date of Patent: Aug. 8, 2023

(54) SPRING PROBE

(71) Applicant: SHENZHEN POMAGTOR PRECISION ELECTRONICS CO., LTD, Shenzhen (CN)

(72) Inventor: Zhengpeng Wei, Shenzhen (CN)

(73) Assignee: SHENZHEN POMAGTOR PRECISION ELECTRONICS CO., LTD, Shenzhen (CN)

( * ) Notice: Subject to any disclaimer, the term of this patent is extended or adjusted under 35 U.S.C. 154(b) by 0 days.

(21) Appl. No.: 16/754,142

(22) PCT Filed: Mar. 19, 2019

(86) PCT No.: PCT/CN2019/078765
§ 371 (c)(1),
(2) Date: Apr. 7, 2020

(87) PCT Pub. No.: WO2020/172927
PCT Pub. Date: Sep. 3, 2020

(65) Prior Publication Data
US 2021/0215741 A1    Jul. 15, 2021

(30) Foreign Application Priority Data
Feb. 27, 2019   (CN) .......................... 201910146345.0

(51) Int. Cl.
*G01R 1/067* (2006.01)
*H01R 13/24* (2006.01)
(52) U.S. Cl.
CPC ....... *G01R 1/06722* (2013.01); *G01R 1/0675* (2013.01); *H01R 13/2421* (2013.01)

(58) Field of Classification Search
CPC .............. G01R 1/06722; G01R 1/0675; H01R 13/2421
See application file for complete search history.

(56) References Cited

U.S. PATENT DOCUMENTS 6,696,850 B1     2/2004  Sanders
2005/0280433 A1*  12/2005  Nelson ............... G01R 1/06722
                                                  324/755.05

(Continued)

FOREIGN PATENT DOCUMENTS

CN          2563774 Y      7/2003
CN        204989256 U      1/2016
(Continued)

*Primary Examiner* — Lee E Rodak
(74) *Attorney, Agent, or Firm* — Bayramoglu Law Offices LLC

(57) ABSTRACT

Disclosed is a spring probe, which comprises a needle tube, a needle with a tail end clamped in the needle tube and capable of moving axially along the needle tube, and a spring arranged between the front end of the needle and the inner bottom of the needle tube and applying thrust to the needle. The open end of the needle tube is circumferentially provided with a plurality of elastic sheets with elasticity. The inner sides of the elastic sheets are provided with first flanges for preventing the needle from separating from the needle tube. The first flanges are pressed against the outer wall of the needle under the action of the elastic force of the elastic sheets. The outer wall of the tail end of the needle head is provided with a second flange which can abut against the first flanges under the action of the spring.

13 Claims, 7 Drawing Sheets

(56) References Cited

U.S. PATENT DOCUMENTS

2018/0323529 A1\* 11/2018 Gruber ............... H01R 13/2421
2019/0109397 A1\* 4/2019 Sugiura ................. H01R 13/17

FOREIGN PATENT DOCUMENTS

| CN | 109121444 A | 1/2019 | |
|----|----|----|----|
| EP | 0270276 A1 | 6/1988 | |
| WO | 2017/147761 | 9/2017 | |
| WO | WO-2017147761 A1 \* | 9/2017 | ............. H01R 13/24 |

\* cited by examiner

SPRING PROBE

CROSS REFERENCE TO THE RELATED APPLICATIONS

This application is the national phase entry of International Application No. PCT/CN2019/078765, filed on Mar. 19, 2019, which is based upon and claims priority to Chinese Patent Applications No. 201910146345.0, filed on Feb. 27, 2019, the entire contents of which are incorporated herein by reference.

FIELD

The present invention relates to the technical field of precision connection, in particular to a spring probe.

BACKGROUND

Spring probe, also known as Pogo Pin, is a spring-typed probe formed by three basic components of a needle, a needle tube and a spring, which are riveted by precision equipment. A tail end of the needle is inserted into the needle tube. Under the action of spring thrust, the needle can move axially along the needle tube. The spring probe is a very fine probe with very small volume. It is often used for precision connection in electronic products such as mobile phones, communications, automobiles, medical treatment, aerospace, etc. The spring probe is connected in the circuit to transmit electrical signals. In order to keep the electrical signal stable during transmission, it is required to maintain electrical contact between the needle tube and the needle at all times, otherwise the electrical signal transmission impedance will increase, and even the signal interruption will be caused.

In order to move the needle axially, the needle is in clearance fit with the inner wall of the needle tube. In order to keep the needle in contact with the needle tube, the tail end of the needle is usually of an inclined plane structure in the prior art. When the spring abuts on the inclined plane, the thrust of the spring on the needle has a component force deviating from the axial direction of the needle, so that when the spring probe works, the needle is in contact with the inner wall of the needle tube. Electrical signals are mainly transmitted through the needle and the needle tube to ensure the stability and low impedance of the spring probe. The disadvantage of the prior art is that when a relatively large amplitude oscillation is encountered, the needle and the needle tube are disconnected resulting in signal interruption. With the application of 5G technology, higher requirements are put proposed for spring probe, which requires low impedance and high stability.

SUMMARY

According to one aspect of the present invention, there is provided with a spring probe, comprising a hollow needle tube, a needle with its tail end is clamped in the needle tube and can move axially along the needle tube, and a spring disposed between the front end of the needle and the inner bottom of the needle tube and exerting a pushing force on the needle The open end of the needle tube is circumferentially provided with a plurality of elastic sheets with elasticity, and the inner sides of the elastic sheets are provided with first flanges for preventing the needle from being separated from the needle tube. The first flanges are pressed against the outer wall of the needle under the action of the elastic force generated by elastic deformation of the elastic sheets. The outer wall of the tail end of the needle is provided with a second flange which can abut against the first flange under the action of the spring. The invention has the beneficial effects that a claw structure is adopted to restrict the needle to prevent the needle from falling out of the needle tube; the claw structure has elasticity, thereby making the needle and the needle tube convenient to assemble and easy to realize mechanical assembly; the needle tube is in close contact with the needle, making the elastic force of the elastic sheets always exists and the first flanges and the needle can still maintain close contact even when the communication equipment vibrates or shakes greatly, which is especially suitable for communication equipment with high frequency and large current.

In some specific embodiments, the first flanges are in interference fits with the outer wall of the needle and is pressed against the outer wall of the needle to achieve good electrical contact.

In some specific embodiments, in the undeformed state of the elastic sheet, the inner edge of each section perpendicular to the central axis of the needle tube of the first flanges are arc-shaped, and the diameter of the inner edge is smaller than the outer diameter of the outer wall of the needle. The diameter of the inner edges of the first flanges are smaller than the outer diameter of the outer wall of the needle, thereby realizing interference fit between the first flanges and the outer wall of the needle. The first flanges are slightly deformed in the pressing process and hug the outer wall of the needle.

In some specific embodiments, in the undeformed state of the elastic sheets, the inner edge and the outer edge of each section perpendicular to the central axis of the needle tube of the elastic sheets are arc-shaped.

In some specific embodiments, the section along the radial direction of the open end is circular, and the open end is formed with a plurality of notches, which divide the open end into a plurality of elastic sheets. The elastic sheets are directly processed and formed on a circular needle tube, so the elastic sheets and the needle tube are in an integrated structure. The inner edge and the outer edge of each section of the elastic sheets formed in this way perpendicular to the central axis of the needle tube is outwardly convex arc-shaped.

In some specific embodiments, the material of the elastic sheets are beryllium bronze. Beryllium bronze has good conductivity, high hardness and excellent elasticity.

In some specific embodiments, the number of elastic sheets is not less than 4. The elastic sheets are directly formed by providing some notches at the open end of the needle tube, so the elastic sheets have an arc shape. In order to enable the elastic sheets to be deformed radially outward, the width of the elastic sheets should not be too large, i. e., the number of the elastic sheets should not be too small.

In some specific embodiments, the rear ends of the first flanges have a first inclined plane facing the inside of the needle tube, and the front end of the second flange has a second inclined plane facing the front end of the needle. When the second flange abuts against the first flanges, the first inclined plane contacts with the second inclined plane to realize electrical conduction between the needle tube and the needle, thereby the risk of poor contact is reduced.

In some specific embodiments, the angle between the first inclined plane and the central axis of the needle tube is a and a is ranging from 35° to 55°. The angle between the second inclined plane and the central axis of the needle tube is β and β is ranging from 35° to 55°.

In some specific embodiments, a third inclined plane facing the tail end of the needle is provided near the front end of the needle. The front edge of the first flanges are provided with a first fillet, and the first flanges are positioned between the third inclined plane and the second flange. In some application scenes of relatively small working height, under the action of the pushing force of the spring, the first flanges abut against the third inclined plane. Because a first fillet is provided on the front edge of the first flange, the first fillet can slide upwards along the third inclined plane for a small distance, so that the third inclined plane slightly expands the inner diameter of the first flange, the elastic sheets undergo certain elastic deformation correspondingly, and the elastic force generated by the deformation of the elastic sheets further presses the first flanges against the third inclined plane making the electrical contact between the first flanges and the third inclined plane or the needle more closer.

In some specific embodiments, the angle between the third inclined plane and the central axis of the needle tube is γ and γ is ranging from 35° to 55°.

In some specific embodiments, the needle is provided with a blind hole into which the spring extends and the end of the spring abuts against the bottom of the blind hole. The blind hole can stabilize the spring to ensure that the spring can expand and contract axially.

In some specific embodiments, the needle tube comprises a sleeve and a plug, one end of the sleeve is provided with some elastic sheets, and the other end is clamped with the plug.

In some specific embodiments, the outer wall of the plug is provided with a rib, the inner wall of the sleeve is provided with a groove, and the front end of the plug extends into the sleeve and the rib is clamped in the groove. The specific embodiment of the present invention realizes mechanical continuity between the sleeve and the plug by adopting a convex-concave matching mode of the rib and the groove, and merely a small amount of interference is needed between the sleeve and the plug to ensure electrical contact between the sleeve and the plug.

In some specific embodiments, the rear end of the needle tube is provided with a rod extending axially along the needle tube and away from the open end. When the spring probe is connected to the PCB, the rod can be soldered to the PCB.

DETAILED DESCRIPTION

The present invention will be described in further detail below with reference to the attached drawings.

For the convenience of describing a specific embodiment of the present invention, the needle head 2 is defined as being forward with respect to the needle tube 1, and the needle tube 1 is rearward with respect to the needle 2.

Figure 1:
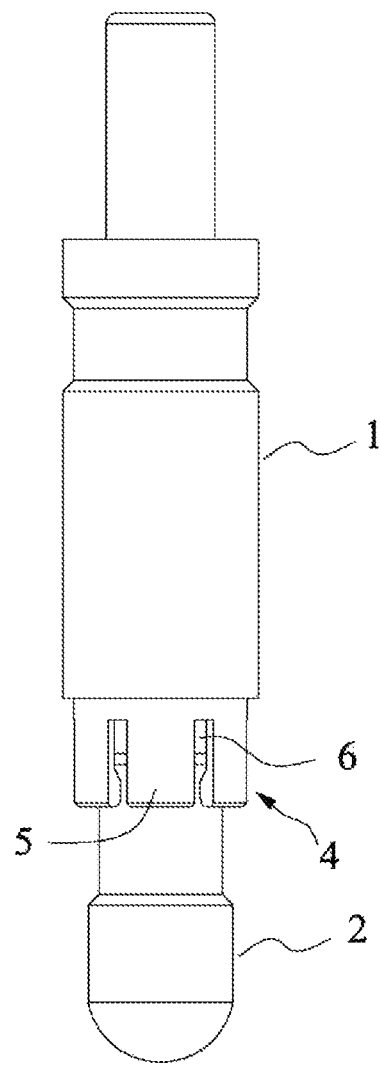
FIG. 1 shows a structural schematic view of one specific embodiment of the spring probe provided by the present invention.
Figure 2:
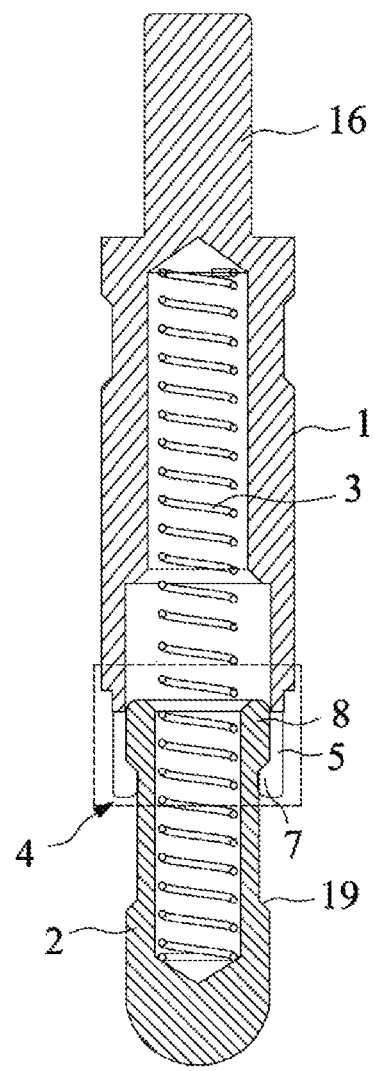
FIG. 2 shows a cross-sectional view of one specific embodiment of the spring probe provided by the present invention.
Figure 3:
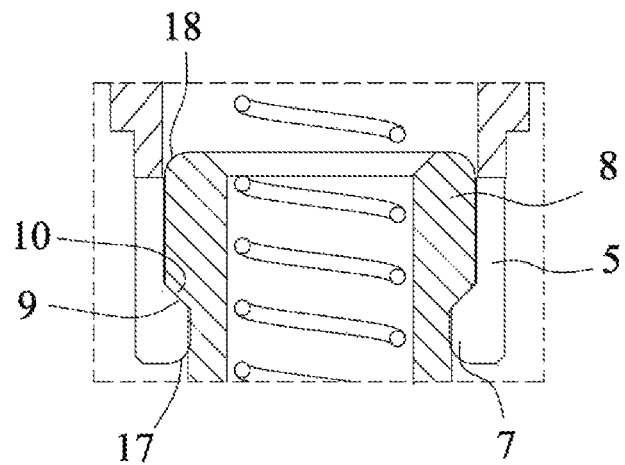
FIG. 3 shows a partial cross-sectional view of a needle tube and needle clamping structure of one specific embodiment of the spring probe provided by the present invention.

Referring to FIGS. 1 to 3, FIG. 1 is a structural schematic view of one specific embodiment of the spring probe provided by the present invention. FIG. 2 is a cross-sectional view along a central axis of one specific embodiment of the spring probe provided by the present invention. FIG. 3 is a partial cross-sectional view of a structure in which the needle tube 1 and the needle 2 are clamped according to one specific embodiment of the spring probe provided by the present invention.

As one or more specific embodiments, the spring probe comprises a hollow needle tube 1, a needle 2 and a spring 3. The tail end of the needle 2 is clamped in the needle tube 1 and the needle 2 can move axially along the needle tube 1. The spring 3 is arranged between the front end of the needle 2 and the inner bottom of the needle tube 1 and the spring 3 applies thrust to the needle head 2. The open end 4 of the needle tube 1 is provided with a plurality of elastic sheets 5 with elasticity circumferentially. The inner sides of the elastic sheets 5 are provided with first flanges 7 for preventing the needle 2 from separating from the needle tube 1. Under the action of the elastic force of the elastic sheets 5, the first flanges 7 are pressed against the outer wall of the needle 2. The outer wall of the tail end of the needle 2 is provided with a second flange 8, and under the action of the spring 3, the second flange 8 can be pressed against the first flanges 7.

In some specific embodiments, the needle tube 1 is preferably a hollow circular tube with one end open and the other end closed. One end of the spring 3 abuts against the inner bottom of the needle tube 1, and the other end abuts against the needle 2. The front end of the needle 2 extends out of the needle tube 1. When the needle 2 is subjected to a sufficiently large axial pressing force, the needle 2 can move into the needle tube 1 against the thrust of the spring 3. When the pressing force is removed, the spring 3 pushes the needle 2 outward toward the needle tube 1. The elastic sheets 5 are located at the open end 4 and extends axially along the needle tube 1, and a plurality of elastic sheets 5 are arranged at intervals. A plurality of elastic sheets 5 are circumferentially arranged at the open end 4, the first flanges 7 are arranged at the inner sides of the elastic sheets 5, the plurality of elastic sheets 5 and the plurality of first flanges 7 form a claw-like structure, and the tail end of the needle 2 extends into the claw. Under the push of the spring 3, the second flange 8 can abut against the first flanges 7, so that the needle 2 can be prevented from falling out of the needle tube 1.

In some specific embodiments of the present invention, the elastic sheets 5 are always elastically deformed radially outward along the needle tube 1. The elastic force generated by the elastic deformation of the elastic sheets 5 presses the first flanges 7 against the outer wall of the needle head 2, i. e., the first flanges 7 and the needle head 2 always keep in close contact, so that the needle tube 1 and the needle 2 always maintain electrical conduction.

In some specific embodiments of the present invention, in order to press the first flanges 7 against the outer wall of the needle 2, the first flanges 7 are in interference fit with the outer wall of the needle 2. The roots of the elastic sheets 5 are fixed, and when the first flanges 7 are in interference fit with the outer wall of the needle 2, the elastic sheets 5 are deformed radially outward along the needle tube 1.

Figure 12:
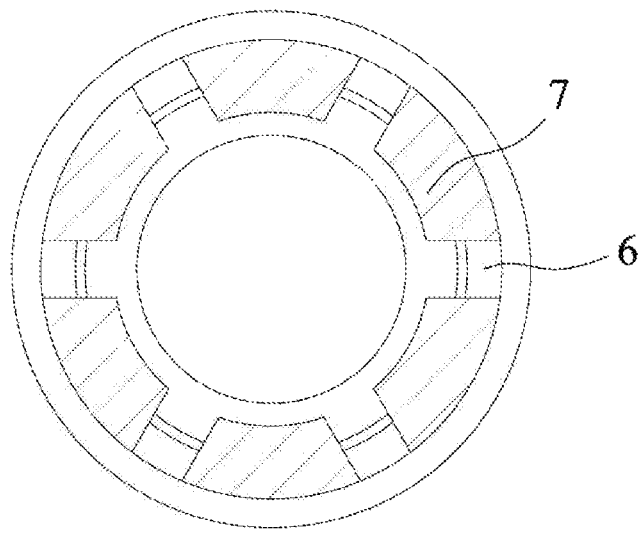
FIG. 12 shows a schematic structural view of a cross section of the first flanges perpendicular to the central axis of the needle tube when the elastic sheets of the needle tube are undeformed provided by the present invention.

Referring to FIG. 12, it is a schematic structural view showing a cross section of the first flanges 7 perpendicular to the central axis of the needle tube 1 in an undeformed state of the elastic sheets 5. For the convenience of expression, the orientation close to the central axis of the needle tube 1 is defined as inside, and the orientation far away from the central axis of the needle tube 1 is defined as outside. In some specific embodiments of the present invention, when the elastic sheets 5 is undeformed, the inner edges of the respective cross section of the first flanges 7 perpendicular to the central axis of the needle tube 1 are arc-shaped, and the diameter of the inner edge is smaller than the outer diameter of the outer wall of the needle 2, so that the first flanges 7 are in interference fit with the outer wall of the needle 2. The shape of the needle 2 is thick at both ends and thin in the middle, so the diameter of the inner edge of each section perpendicular to the central axis of the needle tube 1 of the first flanges 7 is smaller than the outer diameter of the outer wall of the middle part of the needle 2. Since the inner edges of the first flanges 7 are arc-shaped and the outer wall of the needle 2 is cylindrical, when the inner edges of the first flanges 7 are in contact with the outer wall of the needle 2, the first flanges 7 also form a slight amount of elastic deformation and generate a certain amount of elastic force along radial direction under the action of the elastic force of the elastic sheets 5, and the component force of the elastic force makes the first flanges 7 hold the outer wall of the needle tube 2 tightly and further makes the first flanges 7 closely contact with the needle head 2. At the same time, the greater the elastic force of the elastic sheets 5, the greater the amount of micro deformation of the first flanges 7, accordingly the more contact points of the first flanges 7 with the outer wall of the needle 2, and the closer contact at the same time, which improves the stability of the electrical connection between the needle tube 1 and the needle 2 and reduces the impedance. In some specific embodiments, the interference amount can be appropriately increased as required in the art, i.e., the difference between the outer wall diameter of the needle 2 and the inner edge diameter of the first flanges 7 can be increased to increase the deformation amount of the elastic sheets 5, so that the first flanges 7 can be brought into closer contact with the needle 2.

Since the elastic deformation of the elastic sheets 5 is caused by the interference fit between the first flanges 7 and the outer wall of the needle 2, the elastic force of the elastic sheets 5 always exists and the first flanges 7 and the needle 2 can still maintain close contact, even if there is a large amplitude oscillation or shaking for the spring probe provided by the specific embodiment of the present invention. Normally, the size of the elastic sheets 5 is small, and the pressure of the first flanges 7 generated by the elastic force of the elastic sheets 5 against the needle 2 is insufficient to prevent the spring 3 from pushing the needle 2 to move relative to the thrust of the spring 3. Therefore, even if the plurality of first flanges 7 encircle the outer wall of the needle 2, the spring 3 does not affect the axial movement of the needle 2.

A specific embodiment of the present invention provides a method for forming elastic sheets 5 and first flanges 7. An annular flange is formed on the inner wall of the open end 4 of the needle tube 1 in advance, and then a plurality of notches 6 extending axially along the needle tube 1 are formed on the open end 4 of the needle tube 1 by mechanical processing equipment. The notches 6 divide the open end 4 into a plurality of elastic sheets 5. Since the open end 4 has a circular tubular shape, the elastic sheets 5 formed in this way has an outward convex arc-shaped at the inner edge and outer edge of each section perpendicular to the central axis of the needle tube 1 in the undeformed state.

The needle tube 1 is made of a metal material, so the elastic sheets 5 can be elastically deformed when subjected to a certain external force. The elastic force of the elastic sheets 5 are related to the material of the elastic sheets 5, the interference amount of the first flanges 7 with the needle 2, the height of the elastic sheets 5, the width of the elastic sheets 5, the thickness of the elastic sheets 5 and other factors. Those skilled in the art can select appropriate parameters through limited tests according to the technical idea of the present invention.

In some specific embodiments of the present invention, the material of the elastic sheets 5 is beryllium bronze, which has good conductivity, high hardness and excellent elasticity. In other specific embodiments of the present invention, the material of the elastic sheets 5 is stainless steel, which has the advantage of good elasticity but slightly poor conductivity.

In some specific embodiments, the elastic sheets 5 are directly notched at the open end 4 of the needle tube 1, so the elastic sheets 5 have an arc shape. In order to enable the elastic sheets 5 to be deformed radially outward, the width of the elastic sheets 5 cannot be too large, i. e., the number of the elastic sheets 5 cannot be too small. The number of elastic sheets 5 is related to the diameter of the needle tube 1. The larger the diameter of the needle tube 1, the more elastic sheets 5 are required. Preferably, the number of elastic sheets 5 is not less than 4.

Figure 6:
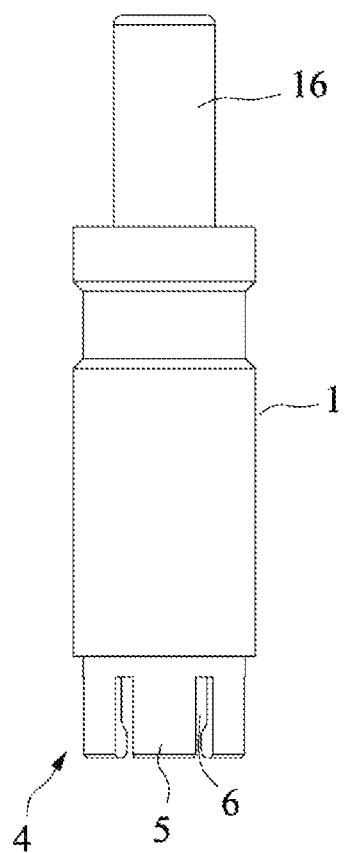
FIG. 6 shows a schematic structural view of one specific embodiment of the needle tube provided by the present invention.
Figure 7:
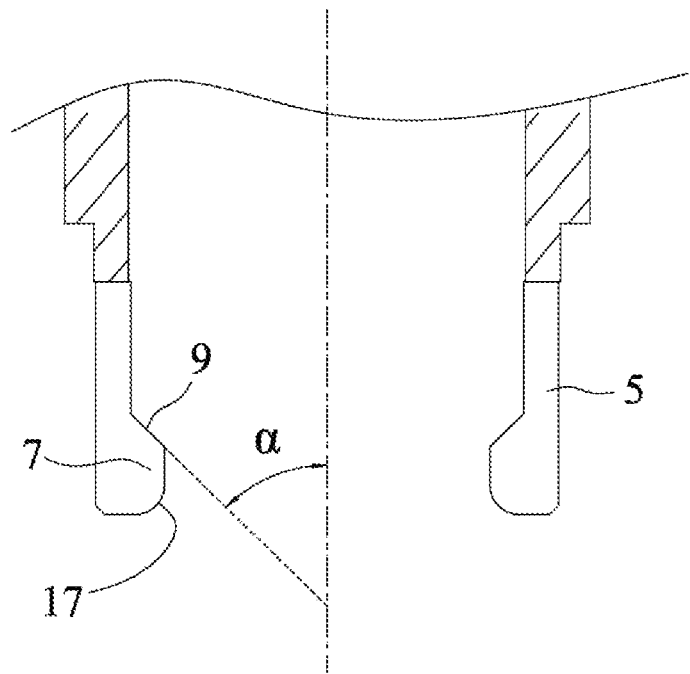
FIG. 7 shows a partial cross-sectional view of one specific embodiment of the open end 4 of the needle tube provided by the present invention.
Figure 8:
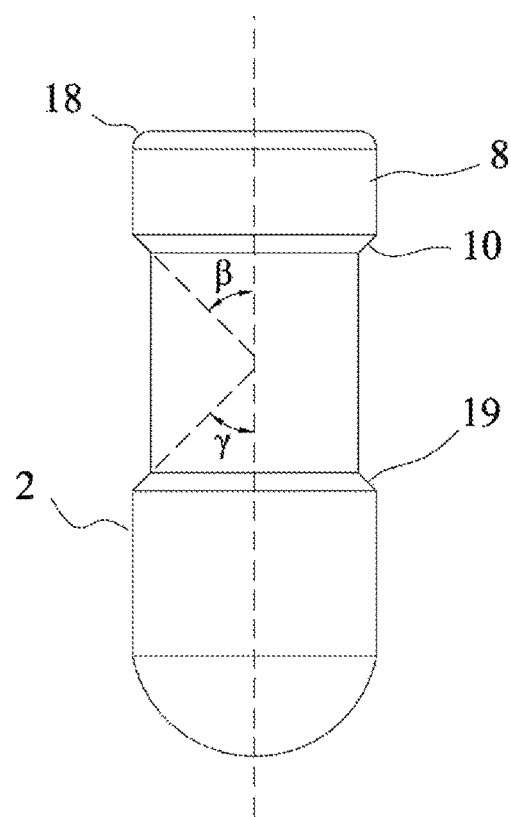
FIG. 8 shows a structural schematic view of one specific embodiment of the needle provided by the present invention.
Figure 9:
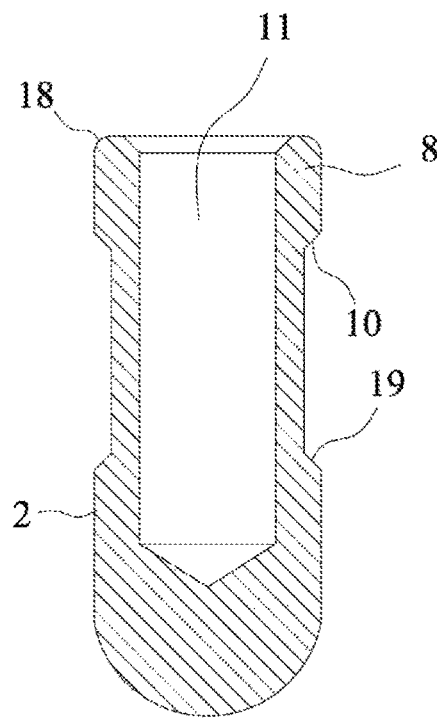
FIG. 9 shows a schematic cross-sectional view of one specific embodiment of the needle provided by the present invention.

Referring to FIGS. 6 to 9, FIG. 6 is a schematic structural view of the needle tube 1 according to one specific embodiment of the present invention. FIG. 7 is a partial sectional view of the open end 4 of the needle tube 1 according to one specific embodiment of the present invention. FIG. 8 is a schematic structural view of the needle 2 according to one specific embodiment of the present invention. FIG. 9 is a schematic cross-sectional view of one specific embodiment of the needle 2 provided by the present invention.

Referring to FIG. 3 and FIGS. 6 to 8, it is preferable that the rear ends of the first flanges 7 have a first inclined plane 9 facing the inside of the needle tube 1, and the front end of the second flange 8 has a second inclined plane 10 facing the front end of the needle 2. When the second flange 8 abuts against the first flanges 7, the first inclined plane 9 is in contact with the second inclined plane 10, thereby realizing electrical conduction between the needle 2 and the needle tube 1. Preferably, the angle between the first inclined plane 9 and the central axis of the needle tube 1 is a and the ranges of a is 35° to 55°. Preferably, the value of a is 40° to 50°. More preferably, the value of a is 45°. The angle between the second inclined plane 10 and the central axis of the needle 2 is β and the range of β is 35° to 55°. Preferably, the value of β is 40° to 50°. More preferably, the value of β is 45°.

Figure 13:
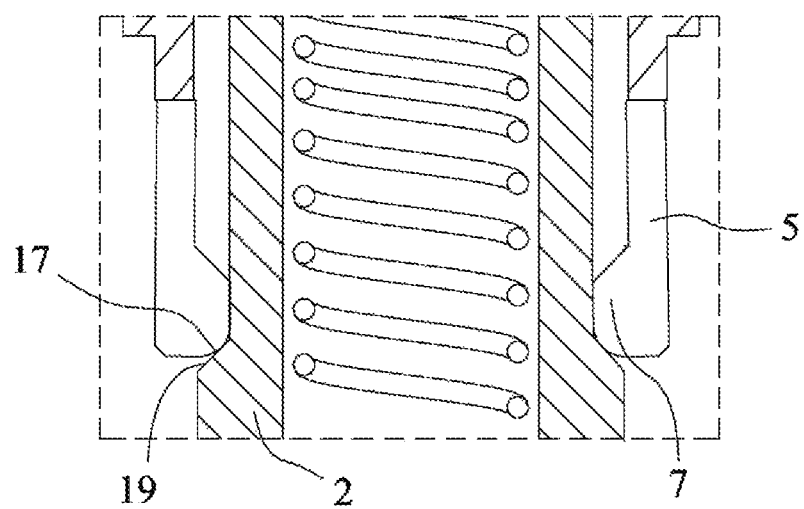
FIG. 13 shows a schematic structural view when the first flanges and the third inclined plane are in contact according to one specific embodiment of the present invention.

Referring to FIGS. 7 to 8, preferably, a third inclined plane 19 facing the tail end of the head 2 is provided near the front end of the needle 2. A first fillet 17 is provided in each front edge of the first flanges 7, and the first flanges 7 are located between the third inclined plane 19 and the second flange 8. The angle between the third inclined plane 19 and the central axis of the needle tube 1 is γ and the range of γ is 35° to 55°. More preferably, the angle is 40° to 50°. More preferably, the angle is 45°. When the needle 2 retracts, the first flanges 7 can move on the outer wall of the needle 2 between the third inclined plane 19 and the second flange 8. The third inclined plane 19 restricts the retraction stroke of the needle 2. Referring to FIG. 13, it is a schematic cross-sectional view when the first flanges 7 contact the third inclined plane 19 according to a specific embodiment of the present invention. In some application scenarios where the working height is relatively small, the first flanges 7 abut against the third inclined plane 19 under the urging force of the spring 3. Since the first fillet 17 is provided on the front edges of the first flanges 7, it can slide along the third inclined plane 19 for a small distance, so that the third inclined plane 19 slightly enlarges the inner diameter of the first flanges 7. Accordingly, the elastic sheets 5 generate elastic deformation, and the elastic force generated by the deformation of the elastic sheets 5 further presses the first flanges 7 against the third inclined plane 19, so that the electrical contact between the first flanges 7 and the third inclined plane 19 or the needle 2 is more tight.

As one or more specific embodiments, referring to FIGS. 8 to 9, the outer edge of the tail end of the needle 2 is provided with a second fillet 18. The first fillet 17 and the second fillet 18 enable the tail end of the needle 2 to enter the needle tube 1 smoothly.

Referring to FIGS. 2 and 9, the needle 2 is preferably provided with a blind hole 11 into which the spring 3 extends and the end of the spring 3 abuts against the bottom of the blind hole 11. The blind hole 11 extends from the tail end of the needle head 2 to the front end of the needle 2 axially along the needle 2. The blind hole 11 can stabilize the spring 3 to ensure that the spring 3 can expand and contract axially.

Figure 10:
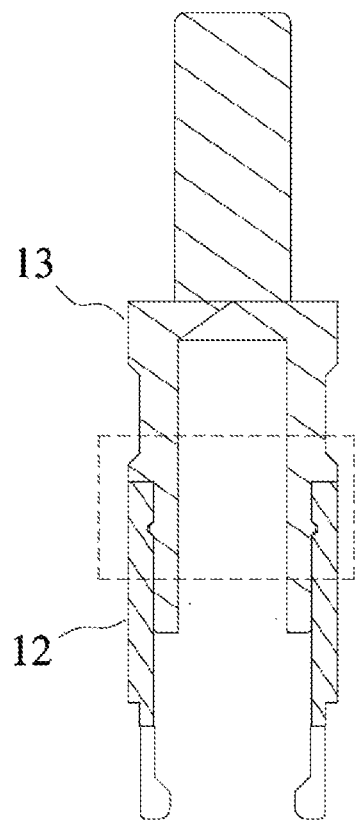
FIG. 10 shows a sectional view of another specific embodiment of the needle tube provided by the present invention.
Figure 11:
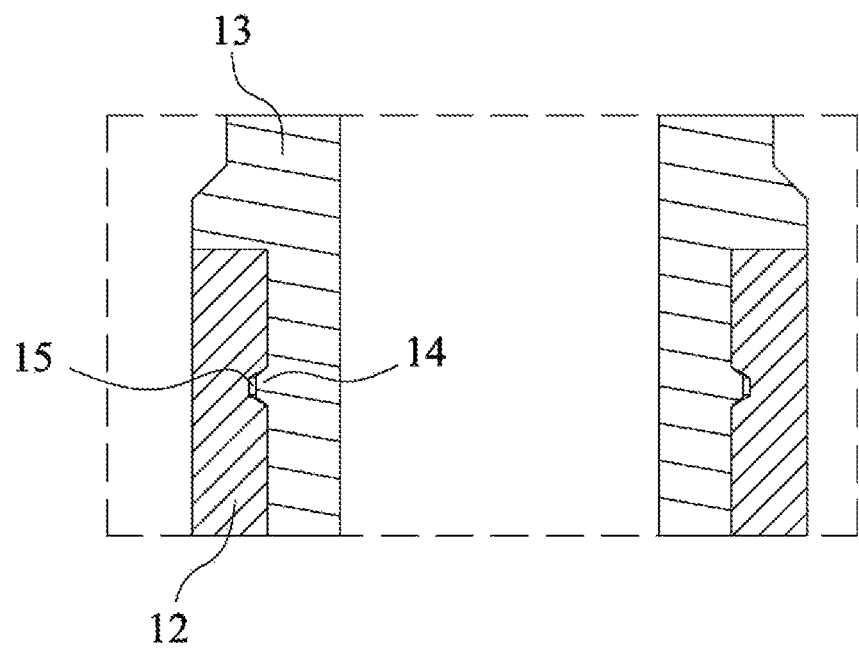
FIG. 11 shows a partial enlarged view of a sectional view of another specific embodiment of the needle tube provided by the present invention.

Referring to FIGS. 10 and 11, FIG. 10 is a cross-sectional view of another specific embodiment of the needle tube 1 provided by the present invention. FIG. 11 is an enlarged cross-sectional view of another specific embodiment of the needle tube 1 provided by the present invention. Preferably, the needle tube 1 comprises a sleeve 12 and a plug 13, one end of the sleeve 12 is provided with an elastic sheet 5, and the other end is clamped with the plug 13. Specifically, the outer wall of the plug 13 is provided with a rib 14, the inner wall of the sleeve 12 is provided with a groove 15, the front end of the plug 13 extends into the sleeve 12 and the rib 14 is clamped in the groove 15. Preferably, both the rib 14 and the groove 15 are annular. The sleeve 12 is a round tube or cylinder with two open ends, and the plug 13 encloses one end of the sleeve 12. The needle tube 1 adopts segmented design, i.e. it is divided into two parts, a sleeve 12 and a plug 13. This design can reduce the requirements of the needle tube 1 on processing equipment. For example, in the segmented design, the sleeve 12 and the plug 13 can be machined by four-axis CNC machining equipment, while the integrated design usually requires higher-cost five-axis CNC machining equipment to complete the machining, so the segmented design reduces the investment of machining equipment. In order to facilitate molding, in some specific embodiments, the elastic sheets 5 are formed by directly machining the notches 6 at the open end 4 of the needle tube 1, so the elastic sheets 5 are integrated within the needle tube 1, i. e., the elastic sheets 5 and the needle tube 1 are made of the same material. In some specific embodiments, beryllium bronze is used as the material for making the elastic sheets 5 in order to obtain good elasticity of the elastic sheets 5, but the price of beryllium bronze is relatively high. In the segmented design of the needle tube 1, the sleeve 12 is made of beryllium bronze with better elasticity but higher price, and the plug 13 can be made of conductive material with good conductivity but relatively lower price, such as brass, etc., which reduces the material cost compared with the integrated design. In order to ensure that current can be conducted from the plug 13 to the sleeve 12, the outer wall of the plug 13 is in interference fit with the inner wall of the sleeve 12, so that the sleeve 12 and the plug 13 are in close contact. In order to firmly fix the sleeve and the plug without the rib 14 and the groove 15, a larger interference amount is required. However, the disadvantage of using a larger interference amount is that the plug is easy to enlarge the inner diameter of the sleeve due to the too large interference amount, with the result that the sleeve and the plug cannot be tightly combined, the impedance between the sleeve and the plug is enlarged, and even result in the fall off of the sleeve and the plug. In the specific embodiment of the present invention, the mechanical connection is mainly realized through the concave-convex fit of the rib 14 and the groove 15, while merely a small amount of interference between the sleeve 12 and the plug 13 is required to ensure good electrical contact between the sleeve 12 and the plug 13.

As one or more specific embodiments, referring to FIG. 6, the rear end of the needle tube 1 is provided with a rod 16. The rod 16 extends axially along the needle tube 1 and is away from the open end 4. When the spring probe is desired to be connected to an PCB, the rod 16 can be soldered to the PCB.

Figure 4:
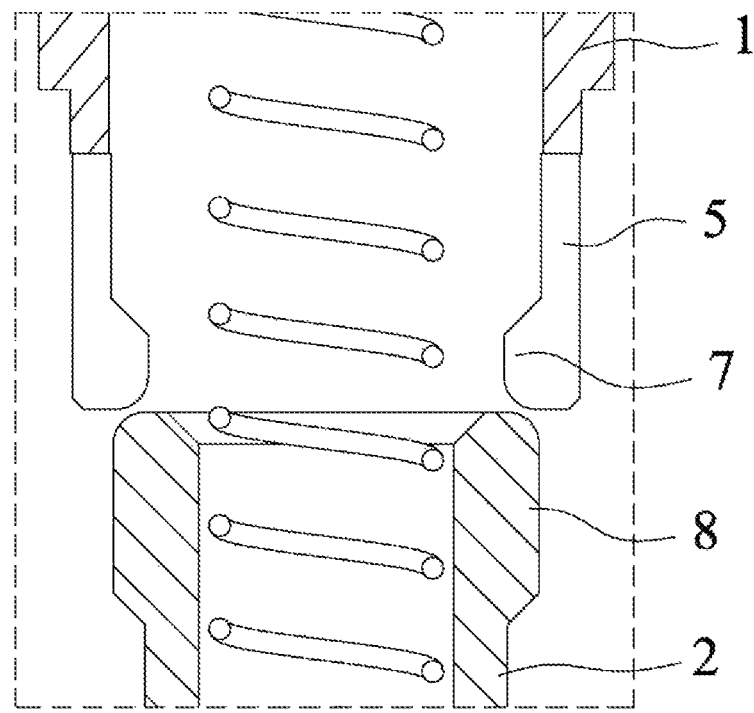
FIG. 4 shows a schematic view of a state when the needle tube and the needle are not clamped of one specific embodiment of the spring probe provided by the present invention.
Figure 5:
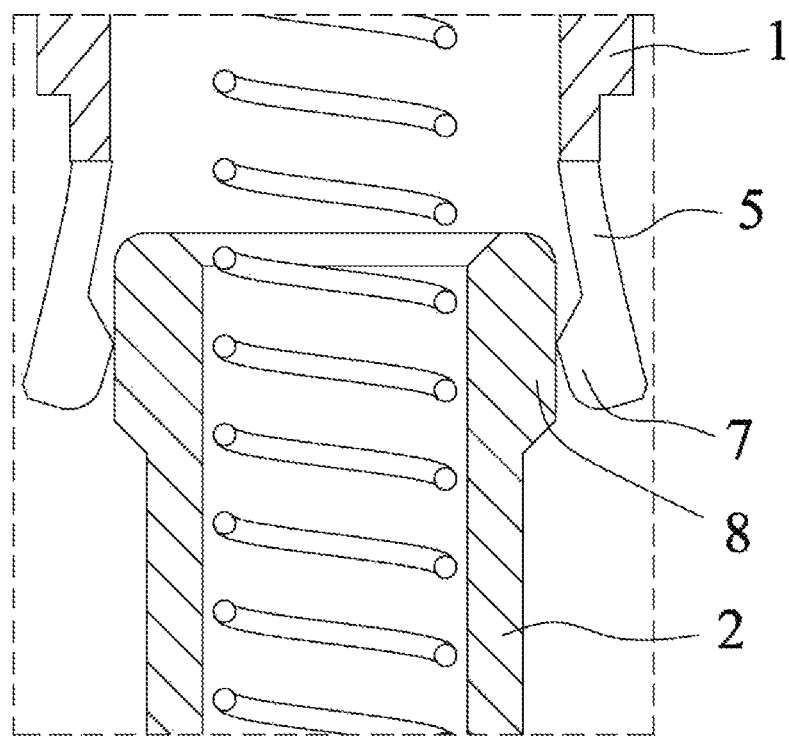
FIG. 5 shows a schematic view of a state of the spring probe of one specific embodiment provided by the present invention in a process of clamping the needle tube and the needle.

Referring to FIGS. 4 to 5, FIG. 4 is a schematic view of a state of a spring probe according to one specific embodiment of the present invention when the needle tube 1 and the needle 2 are not clamped. FIG. 5 is a schematic view of a state of a spring probe according to one specific embodiment of the present invention during the clamping process of the needle tube 1 and the needle 2.

During the process of connecting the needle 2 with the needle tube 1, the needle 2 is kept coaxial with the needle tube 1, and the tail end of the needle 2 is moved toward the inside of the needle tube 1 relatively. During the movement, the second flange 8 will exert pressure on the first flanges 7 to elastically deform the elastic sheets 5 towards the open end 4 circumferentially to expand the claw. When the second flange 8 passes over the first flanges 7, the claw shrinks, the first flanges 7 press against the outer wall of the needle tube 2, and the pushing force of the spring 3 presses the second flange 8 against the inner sides of the first flanges 7. The pushing force of the spring 3 is not sufficient to cause the elastic sheets 5 to undergo large deformation so as to cause the needle 2 separating from the needle tube 1. The spring probe provided by the specific embodiment is easy to realize mechanized assembly, and the assembly efficiency is especially important for the spring probe which is a product in great demand.

What has been described above is merely some specific embodiments of the present invention. For those ordinary skilled in the art, several modifications and improvements can be made without departing from the inventive concept of the present invention, which are all within the scope of protection of the present invention.

What is claimed is:

1. A spring probe, characterized in that the spring probe comprises a hollow needle tube (1), a needle (2) with its tail end clamped in the needle tube (1) and can move axially along the needle tube (1), and a spring (3) arranged between the front end of the needle (2) and the inner bottom of the needle tube (1) and exerting a pushing force on the needle (2), wherein the open end (4) of the needle tube (1) is circumferentially provided with a plurality of elastic sheets (5) with elasticity, the inner sides of the elastic sheets (5) are provided with first flanges (7) for preventing the needle (2) from separating from the needle tube (1), the first flanges (7) are pressed against the outer wall of the needle (2) under the action of the elastic force generated by elastic deformation of the elastic sheets (5), the outer wall of the tail end of the needle (2) is provided with a second flange (8), and the second flange (8) can abut against the first flanges (7) under the action of the spring (3), wherein the rear ends of the first flanges (7) have a first inclined plane (9) facing the inside of the needle tube (1), and the front end of the second flange (8) has a second inclined plane (10) facing the front end of the needle (2), wherein the angle between the first inclined plane (9) and the central axis of the needle tube (1) is a and the range of a is 35° to 55°, and the angle between the second inclined plane (10) and the central axis of the needle (2) is β and the range of is 35° to 55°.

2. The spring probe of claim 1, wherein the first flanges (7) are in interference fit with the outer wall of the needle (2).

3. The spring probe of claim 1, wherein the inner edge of each cross section perpendicular to the central axis of the needle tube (1) of the first flanges (7) is arc-shaped in a state when the elastic sheets (5) is undeformed, and the diameter of the inner edge is smaller than the outer diameter of the outer wall of the needle (2).

4. The spring probe of claim 1, wherein the inner edges and the outer edges of each cross section perpendicular to the central axis of the needle tube (1) of the elastic sheets (5) are arc-shaped when the elastic sheets (5) is undeformed.

5. The spring probe of claim 1, wherein the cross section of the open end (4) in the radial direction is circular, the open end (4) is formed with a plurality of notches (6), and the notches (6) divide the open end (4) into a plurality of elastic sheets (5).

6. The spring probe of claim 1, wherein the material of the elastic sheets (5) is beryllium bronze or stainless steel.

7. The spring probe of claim 1, wherein the number of the elastic sheets (5) is not less than 4.

8. The spring probe of claim 1, wherein a third inclined plane (19) facing the tail end of the needle (2) is arranged near the front end of the needle (2), the front edges of the first flanges (7) are provided with a first fillet (17), and the first flanges (7) are positioned between the third inclined plane (19) and the second flange (8).

9. The spring probe of claim 8, wherein the angle between the third inclined plane (19) and the central axis of the needle (2) is γ and the range of γ is 35° to 55°.

10. The spring probe of claim 1, wherein the needle (2) is provided with a blind hole (11), the spring (3) extends into the blind hole (11) and the end of the spring (3) abuts against the bottom of the blind hole (11).

11. The spring probe of claim 1, wherein the needle tube (1) comprises a sleeve (12) and a plug (13), one end of the sleeve (12) is provided with the elastic sheets (5), and the other end is clamped with the plug (13).

12. The spring probe of claim 11, wherein the outer wall of the plug (13) is provided with a rib (14), the inner wall of the sleeve (12) is provided with a groove (15), the front end of the plug (13) extends into the sleeve (12) and the rib (14) is clamped in the groove (15).

13. The spring probe according to claim 1, wherein the tail end of the needle tube (1) is provided with a rod (16) extending axially along the needle tube (1) and away from the open end (4).

* * * * *